(12) United States Patent
Wakamatsu et al.

(10) Patent No.: US 7,659,548 B2
(45) Date of Patent: Feb. 9, 2010

(54) WHITE LIGHT EMITTING DIODE AND METHOD OF MANUFACTURING THE SAME

(75) Inventors: Hideaki Wakamatsu, Hachioji (JP); Hiroyuki Nabeta, Hachioji (JP)

(73) Assignee: Konica Minolta Holdings, Inc., Tokyo (JP)

( * ) Notice: Subject to any disclaimer, the term of this patent is extended or adjusted under 35 U.S.C. 154(b) by 156 days.

(21) Appl. No.: 11/570,952

(22) PCT Filed: Jun. 10, 2005

(86) PCT No.: PCT/JP2005/010640

§ 371 (c)(1),
(2), (4) Date: Jan. 16, 2007

(87) PCT Pub. No.: WO2005/124878

PCT Pub. Date: Dec. 29, 2005

(65) Prior Publication Data

US 2007/0176194 A1    Aug. 2, 2007

(30) Foreign Application Priority Data

Jun. 22, 2004    (JP) .............................. 2004-183649

(51) Int. Cl.
*H01L 33/00*    (2006.01)
(52) U.S. Cl. .................... 257/98; 257/428; 257/431; 438/65; 438/82
(58) Field of Classification Search ............... 257/98, 257/428, 431; 438/65, 82
See application file for complete search history.

(56) References Cited

U.S. PATENT DOCUMENTS

| | | | | |
|---|---|---|---|---|
| 4,691,140 | A * | 9/1987 | Sakakibara et al. | 313/486 |
| 5,674,698 | A * | 10/1997 | Zarling et al. | 435/7.92 |
| 5,686,781 | A * | 11/1997 | Kim | 313/112 |
| 6,869,753 | B2 * | 3/2005 | Chua et al. | 430/320 |
| 7,202,598 | B2 * | 4/2007 | Juestel et al. | 313/503 |
| 7,258,587 | B2 * | 8/2007 | Hwang | 445/24 |
| 2005/0093774 | A1 * | 5/2005 | Tanaka et al. | 345/41 |
| 2005/0239227 | A1 * | 10/2005 | Aanegola et al. | 438/26 |
| 2005/0264194 | A1 * | 12/2005 | Ng et al. | 313/512 |
| 2005/0282976 | A1 * | 12/2005 | Haitko et al. | 525/476 |
| 2006/0181197 | A1 * | 8/2006 | Nago et al. | 313/503 |
| 2008/0017875 | A1 * | 1/2008 | Lee et al. | 257/98 |

* cited by examiner

*Primary Examiner*—Phuc T Dang
(74) *Attorney, Agent, or Firm*—Lucas & Mercanti, LLP

(57) ABSTRACT

Employing a LED which emits light via excitation with UV light, particularly the foregoing high-power LED, disclosed are a white LED exhibiting high reliability and longer operating life, and a method of manufacturing the white LED. Also disclosed are a white light emitting diode possessing a phosphor layer which emits light via excitation with UV light, wherein the phosphor layer consists of phosphor, or possesses phosphor and transparent inorganic oxide, and a method of manufacturing the white light emitting diode, possessing the step of making phosphor particles to collide with a light emitting diode at high speed to deposit the phosphor layer, employing an aerosol deposition process.

5 Claims, 1 Drawing Sheet

WHITE LIGHT EMITTING DIODE AND METHOD OF MANUFACTURING THE SAME

This application is a 371 of PCT/JP05/10640 Jun. 10, 2005

TECHNICAL FIELD

The present invention relates to a white light emitting diode (white LED) in which light emitted from a LED element emitting in the UV region is converted into white light, and a method of manufacturing a white LED.

BACKGROUND

In recent years, a white LED has been brought to attention as a white lighting light source exhibiting high efficiency as well as high reliability, and has already been utilized partly as a small-size low electric power light source. It is commonly known that this kind of LED is a LED in which a blue LED element is covered by a mixture of a yellow phosphor and a transparent resin, and a white LED and a phosphor used for the white LED with this method are disclosed (refer to Patent Documents 1-3).

However, there are a number of problems to be solved in this method as a light source for back light and general lighting, since no red component is contained in white light obtained in this method. On the other hand, attention has recently been focused on a white light emitting diode utilizing a LED emitting in the UV region because of no drawback as described above. However, a type of diode molded in a conventional resin tends to deteriorate the resin since energy generated via emission is large. Therefore, the resin loses the color by using the white LED having such the structure for long duration, whereby the color tone is also changed. Further, in recent years, though there is a move to introduce the development of a white lighting light source by employing a high-power LED element, the resin is seriously deteriorated in this case since a limited area is exposed to extremely large energy blue light, whereby change of an emission color is caused in an extremely short period of time. There is also a problem such that the emission color tone was changed over time, since a heat discharge property of a resin-molded element is poor, whereby temperature rise is easily generated.

(Patent Document 1) Japanese Patent O.P.I. Publication No. 10-163535

(Patent Document 2) WO98/05078; descriptive literature (Patent Document 3) Japanese Patent O.P.I. Publication No. 2002-43624

DISCLOSURE OF THE INVENTION

The present invention was made on the basis of the above-described situation. It is an object of the present invention to provide a white LED exhibiting high reliability and longer operating life, which is prepared via use of a UV-emitting LED; particularly a high-energy UV-emitting LED, and a manufacturing method of the same.

After considerable effort during intensive studies, it was to be understood that the object of the present invention was accomplished by following structures.

(Structure 1) A white light emitting diode possessing a phosphor layer which emits light via excitation with UV light, wherein the phosphor layer consists of a phosphor.

(Structure 2) A white light emitting diode possessing a phosphor layer which emits light via excitation with UV light, wherein the phosphor layer possesses a phosphor and a transparent inorganic oxide.

(Structure 3) A method of manufacturing the white light emitting diode of Structure 1, possessing the step of making phosphor particles to collide with a light emitting diode to deposit the phosphor layer on a surface of the light emitting diode, employing an aerosol deposition process.

(Structure 4) The method of manufacturing the white light emitting diode of Structure 2, possessing the step of making the phosphor particles to collide with a light emitting diode to deposit the phosphor layer on a surface of the light emitting diode, employing an aerosol deposition process.

(Structure 5) The method of manufacturing the white light emitting diode of Structure 2, possessing the step of making the phosphor particles and the transparent inorganic oxide to collide with a light emitting diode to deposit the phosphor layer on a surface of the light emitting diode, employing an aerosol deposition process.

DESCRIPTION OF THE PREFERRED EMBODIMENTS

After considerable effort during intensive studies, the inventors have found out that as to a white LED comprising a UV light emitting diode and thereon a phosphor layer converting into blue light, green light and red light with a UV light, a white LED comprising the phosphor layer consisting of phosphor, or possessing phosphor and transparent inorganic oxide exhibits longer operating life. A commonly usable phosphor particle dispersing binder may not be used for this white LED, since phosphor particles are fused on a UV light emitting diode by an aerosol deposition process to form a phosphor layer. Therefore, it was found out in this case that a luminance drop caused by a deteriorated binder during operation was possible to be prevented, whereby longer operating life was to be achieved. Next, a white light emitting diode (LED) of the present invention and a method of manufacturing the white LED of the present invention will be further described in detail.

Figure 2:
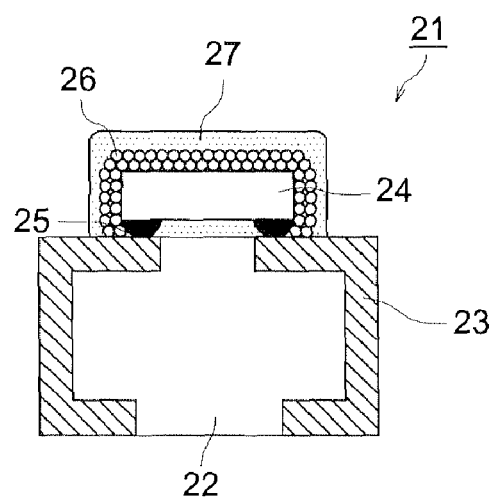
FIG. 2 is a schematic cross-sectional view showing a white LED of the present invention.

FIG. 2 is a schematic cross-sectional view showing white LED 21 of the present invention. After forming bumps 25 on the surface of UV emitting LED chip 24, UV emitting LED chip 24 is turned over to be connected to electrodes 23 on substrate 22 (so-called flip-chip bonding). Phosphor layer 26 is further formed on the UV emitting LED by a film forming method in which phosphor particles of the present invention are deposited via high-speed collision of the particles. Sealing layer 27 made of transparent inorganic oxide may further be formed on phosphor layer 26 as shown in FIG. 2.

Any of $In_xGa_{1-x}N$ system such as InGaN and the like is usable as a UV emitting LED usable in the present invention. It is preferred that a UV emitting LED has a light emission peak wavelength is 140-420 nm.

A commercially available phosphor capable of converting light emitted from a UV emitting LED into each of red origin light, green origin light and blue origin light is a phosphor usable in the present invention, and the following phosphors are, for example, usable.

Red origin: $Y_2O_3S:Eu^{3+}$, CaS:Eu, $3.5MgO.0.5MgF_2.GeO_2:Mn$, $K_5Eu_{2.5}(WO_4)_{6.25}$, $GdMgB_5O_{10}:Ce^{3+}$, $(Y,Ca)_{4C}O_{40}Sn_{20}:Eu^{3+}$ Green origin: ZnS:Cu,Al, $Ba_2SiO_4$:Eu, $ZnGe_2O_4$:Eu, $LaPO_4$:$Ce^{3+}$, $(Ba,Mg)Al_{10}O_{17}$:Eu,Mn, $(Ca,Zn)Ge_{14}O_{57}$:$Mn^{2+}$, $3(Ba,Mg,Eu,Mn)O \cdot 8Al_2O_3$ Blue origin $Ba_{(1-a)}Eu_aMgAl_{10}O_{17}$, CaSrS:Bi, CaS:Bi, $(Ba,Ca,Sr,Mg)_{10}(PO_4)_6Cl_2$:$Eu^{2+}$ Transparent inorganic oxide and further the foregoing phosphor may be mixed in a phosphor layer of the present invention. A mixing ratio (by volume) of phosphor to transparent inorganic oxide is in the range of 10-100% of phosphor, and preferably in the range of 50-100% of phosphor. Examples of usable transparent inorganic oxide in the present invention include $SiO_2$, $Al_2O_3$ and so forth. A white LED also has a thickness of 1-1000 μm, and preferably 5-100 μm.

Process of Forming a Phosphor Layer

Utilized is a film formation method (so-called aerosol deposition process) in which particles of phosphor and transparent inorganic oxide collide with a UV emitting LED as a substrate at high speed to deposit the particles, in order to form a phosphor layer in the present invention.

An aerosol deposition film-forming apparatus disclosed in "OYO-BUTURI" (Vol. 68, No. 1, Page 44) and Japanese Patent O.P.I. Publication 2003-215256 can be utilized.

Figure 1:
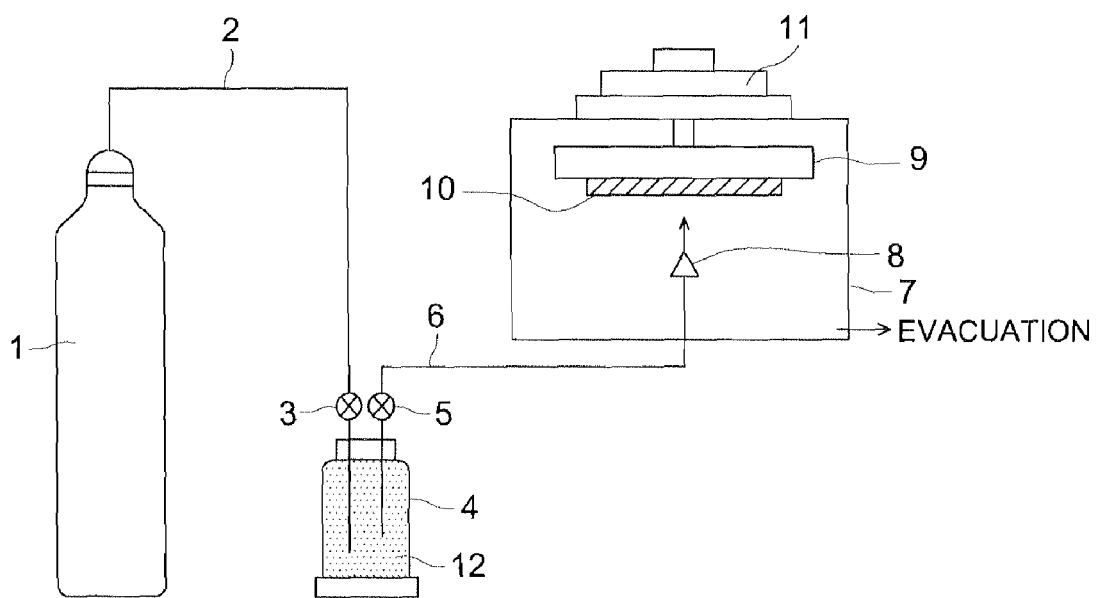
FIG. 1 is a schematic diagram showing an aerosol deposition film-forming apparatus.

FIG. 1 shows a schematic diagram of an aerosol deposition film-forming apparatus used in the present invention. The aerosol deposition film-forming apparatus is equipped with holder 9 supporting substrate 10, XYZθ stage 11 to set the holder 9 in 3 dimensional motion, nozzle 8 having a narrow opening to spray a raw material onto the substrate, nozzle 8 introduced into chamber 7 connected to aerosol generation container 4 via pipe 6, high-pressure gas cylinder 1 to accumulate a carrier gas, aerosol generation container 4 in which particle raw material 12 and the carrier gas transferred via pipe 2 (valves 3 and 5) are stirred to be mixed). A temperature control system with a peltiert element is placed on the back surface of the stage to keep the substrate in optimum temperature.

Further, the particle raw material in the aerosol generation container is formed on the UV emitting LED as a substrate by the following procedures.

The raw material particle filled in the aerosol generation container has a preferable particle diameter of 0.02-5 μm, or a more preferable particle diameter of 0.1-2 μm. The particle raw material passes through the pipe to the aerosol generation container from the high-pressure gas cylinder with the accumulated carrier gas, and the particle raw material together with the carrier gas is aerosolized via vibration while stirring.

In order to measure a particle diameter of the raw material particle, a conventional laser diffraction type particle size analyzer is employed. Specific examples of the laser diffraction type particle size analyzer include HELOS (manufactured by JEOL Ltd), MICROTRAC HRA (manufactured by Nikkiso Co., Ltd.), SALD-1100 (manufactured by Shimadzu Corp.) and COULTER COUNTER (manufactured by Coulter Corp.). Of these, MICROTRAC ERA is preferably employed.

The aerosolized particle raw material passes through the pipe, and the particle raw material together with the carrier gas is sprayed onto the substrate from the nozzle having a narrow opening in the chamber to form a coating layer. The chamber is evacuated by a vacuum pump or such, and a vacuum degree inside the chamber is arranged to be adjusted if desired. In the present invention, the vacuum degree is preferably 0.01-10000 Pa, and more preferably 0.1-1000 Pa. Further, a phosphor layer having a desired thickness is possible to be formed at the predetermined portion of the substrate, since the substrate holder can be moved by setting the XYZθ stage in 3 dimensional motion. A phosphor protective layer can be formed on the resulting phosphor layer, if desired.

The aerosolized raw material particles can be deposited on the substrate surface via collision by using a carrier gas having a preferable flow speed of 100-400 m/sec. The particles colliding with the carrier gas are also bonded via impact caused by collision with each other to form a layer.

In the manufacturing method of the present invention, inert gas such as $N_2$ gas or He gas is preferable as a carrier gas to accelerate and spray the raw material particles, but $N_2$ gas is more preferably usable.

It is preferred that a temperature of at least—100° C. and at most 200° C. is also maintained as a temperature of the substrate to collide the raw material particles with. In the case of a substrate temperature of at least 300° C., a layer becomes milky-white, whereby luminance of a white LED tends to be deteriorated since light is not taken out.

Particles of at least the foregoing phosphor are employed to form a phosphor layer. The foregoing transparent inorganic oxide particles may further be mixed, if desired. The aerosol generation containers for the phosphor and additionally for the transparent inorganic oxide are installed in the foregoing film-forming apparatus, and a phosphor distribution in the phosphor layer may be controlled by changing one feed raw material to another appropriately. The phosphor concentration in the phosphor layer can be controlled by appropriately mixing a phosphor with a transparent inorganic oxide. In the case of forming only the transparent inorganic oxide layer on the outermost surface, it is usable as a transparent sealing layer. On the other hand, only the transparent inorganic oxide layer may be formed on the UV emitting LED surface. It is also possible to form a layer composed of no transparent inorganic oxide, but only a phosphor.

An emitting LED chip in which a phosphor layer is formed is fitted with a transparent resin cover made of a silicone resin or such, or a glass cover at the phosphor film-formed portion of the light emitting chip to complete a white LED. The rated direct current load up to a maximum voltage and current of 5 V and 30 mA, respectively, for example, is applied to a white LED of the present invention to emit light, whereby white light emission can be obtained.

EXAMPLE

Next, the present invention will now be described in detail referring to examples, however, the present invention is not limited thereto.

Example 1

White LED with Three Independent Color LEDs

Red LED

A yellow phosphor layer was prepared employing an aerosol deposition film-forming apparatus as shown in FIG. 1. 3.5 $MgO \cdot 0.5MgF_2 \cdot GeO_2$:Mn phosphor particles having a particle size distribution of 0.1-1 μm and an average particle diameter of 0.5 μm were filled in an aerosol generation container, and sprayed onto a UV emitting LED chip InGaN (0.4 mm-square) having a light emission peak wavelength of 380 nm under the conditions of a chamber vacuum degree of 100 Pa and a substrate temperature of 20° C., employing $N_2$ gas with a flow rate of 200 m/s as a carrier gas to prepare a 10 μm thick film, whereby an red LED was obtained.

Green LED

Employing the same apparatus as used in preparation of a red LED, $ZnGe_2O_4$:Eu phosphor particles having a particle size distribution of 0.1-1 μm and an average particle diameter of 0.5 μm were filled in an aerosol generation container, and sprayed onto a UV emitting LED chip InGaN (0.4 mm-square) having a light emission peak wavelength of 380 nm under the conditions of a chamber vacuum degree of 100 Pa and a substrate temperature of 20° C., employing $N_2$ gas with a flow rate of 200 m/s as a carrier gas to prepare a 10 μm thick film, whereby a green LED was obtained.

Blue LED

Employing the same apparatus as used in preparation of a red LED as well as a green LED, CaSrS:Bi phosphor particles having a particle size distribution of 0.1-1 μm and an average particle diameter of 0.5 μm were filled in an aerosol generation container, and sprayed onto a UV emitting LED chip InGaN (0.4 mm-square) having a light emission peak wavelength of 380 nm under the conditions of a chamber vacuum degree of 100 Pa and a substrate temperature of 20° C., employing $N_2$ gas with a flow rate of 200 m/s as a carrier gas to prepare a 10 μm thick film, whereby a blue LED was obtained.

A module of the above 3 LEDs prepared independently is arranged to obtain a white LED. Module arrangement described here means a hybrid situation where independent LEDs are arranged in combination so as to be able to obtain white light by using the above-described three independent color LEDs.

Example 2

Three Color Mixture White LED

Employing the same apparatus as in Example 1, after previously mixing 3.5 $MgO.0.5MgF_2.GeO_2$:Mn phosphor particles, $ZnGe_2O_4$:Eu phosphor particles and CaSrS:Bi phosphor particles having a particle size distribution of 0.1-1 μm and an average particle diameter of 0.5 μm, the mixture thereof was filled in an aerosol generation container, and sprayed onto a UV emitting LED chip InGaN (0.4 mm-square) having a light emission peak wavelength of 380 nm under the conditions of a chamber vacuum degree of 100 Pa and a substrate temperature of 20° C., employing $N_2$ gas with a flow rate of 200 m/s as a carrier gas to prepare a 10 μm thick film, whereby a white LED was obtained.

Comparative Example

Three Color Mixture White LED Via Coating

A mixture solution, in which 3.5 $MgO.0.5MgF_2.GeO_2$:Mn phosphor particles, $ZnGe_2O_4$:Eu phosphor particles and CaSrS:Bi phosphor particles are dispersed in an epoxy resin (NT8014, produced by Nitto Denko Corporation) and an acid anhydride hardener, was prepared.

After fifty μl of a mixture solution of the above phosphor and resin were dripped onto a UV emitting LED chip InGaN (0.4 mm-square) having a light emission peak wavelength of 380 nm, employing an injection syringe and the resulting was dried, it was further covered with a half-circle-shaped transparent epoxy resin cover to obtain a white LED.

Evaluation

Each of white LEDs of Example 1, Example 2 and Comparative example was operated at 50° C. and 20 mA to determine the period of half decay, based on the initial light flux. The results are shown in Table 1.

TABLE 1

| Sample | Period of half decay (hr) |
| --- | --- |
| Example 1 | 27,200 |
| Example 2 | 27,100 |
| Comparative example | 5,100 |

It is to be understood that a white LED exhibiting longer operating life can be provided in the present invention, as described above.

POSSIBILITY OF INDUSTRIAL USE

A light emitting diode comprising a phosphor layer which emits light via excitation with UV light was employed, whereby a white light emitting diode exhibiting high reliability and longer operating life was possible to be provided.

What is claimed is:

1. A white light emitting diode comprising:
   a phosphor layer formed on a light emitting diode which emits light via excitation with UV light,
   wherein the phosphor layer consists of a phosphor.

2. A white light emitting diode comprising:
   a phosphor layer formed on a light emitting diode which emits light via excitation with UV light,
   wherein the phosphor layer consists of a phosphor and a transparent inorganic oxide.

3. A method of manufacturing the white light emitting diode of claim 1, comprising the step of:
   making phosphor particles to collide with a light emitting diode to deposit the phosphor layer on a surface of the light emitting diode, employing an aerosol deposition process.

4. The method of manufacturing the white light emitting diode of claim 2, comprising the step of:
   making phosphor particles to collide with a light emitting diode to deposit the phosphor layer on a surface of the light emitting diode, employing an aerosol deposition process.

5. The method of manufacturing the white light emitting diode of claim 2, comprising the step of:
   making phosphor particles and transparent inorganic oxide particles to collide with a light emitting diode to deposit the phosphor layer on a surface of the light emitting diode, employing an aerosol deposition process.

* * * * *